(12) United States Patent
Oohira

(10) Patent No.: US 7,391,207 B2
(45) Date of Patent: Jun. 24, 2008

(54) ROTATION ANGLE DETECTOR

(75) Inventor: Satoshi Oohira, Gifu (JP)

(73) Assignee: DENSO CORPORATION, Kariya (JP)

( * ) Notice: Subject to any disclaimer, the term of this patent is extended or adjusted under 35 U.S.C. 154(b) by 213 days.

(21) Appl. No.: 11/188,877

(22) Filed: Jul. 26, 2005

(65) Prior Publication Data

US 2006/0028204 A1 Feb. 9, 2006

(30) Foreign Application Priority Data

Aug. 6, 2004 (JP) ............................. 2004-231341
May 24, 2005 (JP) ............................. 2005-151589

(51) Int. Cl.
G01B 7/30 (2006.01)
G01R 33/06 (2006.01)
H01L 43/08 (2006.01)

(52) U.S. Cl. .............................. 324/207.25; 324/207.2

(58) Field of Classification Search .............. 324/207.2, 324/207.21, 207.25, 251; 338/32 R, 32 H; 73/514.31
See application file for complete search history.

(56) References Cited

U.S. PATENT DOCUMENTS

| | | | | |
|---|---|---|---|---|
| 4,283,679 A | * | 8/1981 | Ito et al. ................... | 324/165 |
| 4,642,496 A | * | 2/1987 | Kerviel et al. ............. | 310/68 B |
| 4,668,914 A | * | 5/1987 | Kersten et al. ............ | 324/251 |
| 4,873,655 A | * | 10/1989 | Kondraske ................ | 702/86 |
| 4,875,011 A | * | 10/1989 | Namiki et al. ............. | 324/251 |
| 5,614,754 A | | 3/1997 | Inoue | |
| 5,769,249 A | | 6/1998 | Lascara | |
| 5,796,249 A | | 8/1998 | Andrä et al. | |
| 5,880,586 A | * | 3/1999 | Dukart et al. ............. | 324/207.2 |
| 6,104,231 A | | 8/2000 | Kirkpatrick, II | |
| 6,201,389 B1 | * | 3/2001 | Apel et al. ................ | 324/207.2 |
| 6,288,533 B1 | * | 9/2001 | Haeberli et al. ........... | 324/207.2 |
| 6,326,780 B1 | * | 12/2001 | Striker .................... | 324/207.21 |
| 6,492,697 B1 | * | 12/2002 | Plagens et al. ............. | 257/426 |
| 6,545,462 B2 | * | 4/2003 | Schott et al. ............. | 324/207.2 |
| 6,937,012 B2 | | 8/2005 | Saito | |
| 6,969,988 B2 | | 11/2005 | Kakuta et al. | |

(Continued)

FOREIGN PATENT DOCUMENTS

JP A-61-223572 10/1986

(Continued)

OTHER PUBLICATIONS

Notification of Reasons for Rejection (with English translation) and citations dated Jul. 18, 2007 issued in the corresponding Japanese patent application No. 2005-151589.

(Continued)

*Primary Examiner*—Reena Aurora
*Assistant Examiner*—Kenneth J. Whittington
(74) *Attorney, Agent, or Firm*—Posz Law Group, PLC

(57) ABSTRACT

A rotation angle detector detects a rotation angle of a magnetic field by selectively using a hall element from a plurality of hall elements disposed on one side of a semiconductor substrate. The hall elements are equiangularly disposed to each other in a ring shape. The rotation angle of the magnetic field is detected by using a portion of an output signal of the hall element having a substantially linear output characteristic.

2 Claims, 10 Drawing Sheets

U.S. PATENT DOCUMENTS

| | | | |
|---|---|---|---|
| 7,053,609 B2 | 5/2006 | Saito | |
| 7,119,538 B2* | 10/2006 | Blossfeld | 324/251 |
| 7,208,940 B2* | 4/2007 | Withanawasam et al. | 324/207.25 |
| 2002/0190709 A1* | 12/2002 | Frederick et al. | 324/207.2 |
| 2003/0128026 A1* | 7/2003 | Lutz | 324/207.2 |

FOREIGN PATENT DOCUMENTS

| | | |
|---|---|---|
| JP | A-2-128103 | 5/1990 |
| JP | A-4-302406 | 10/1992 |
| JP | A-7-162055 | 6/1995 |
| JP | A-8-005312 | 1/1996 |
| JP | A-2001-349747 | 12/2001 |
| JP | A-2002-116055 | 4/2002 |
| JP | A-2002-323345 | 11/2002 |
| JP | A-2004-012156 | 1/2004 |
| JP | A-2005-172527 | 6/2005 |

OTHER PUBLICATIONS

S. Kawahito et al. "MOS Hall Elements with Three-Dinemsional Microstructure." Transducers 93', 1993. The 7th International Conference on Solid-State Sensors and Actuators, pp. 892-895. (discussed on p. 1 in the specification).

* cited by examiner $\theta$ : HALL ANGLE

ROTATION ANGLE DETECTOR

CROSS REFERENCE TO RELATED APPLICATION

This application is based on and claims the benefit of priority of Japanese Patent Application No. 2004-231341 filed on Aug. 6, 2004, and Japanese Patent Application No. 2005-151589 filed on May 24, 2005, the disclosure of which is incorporated herein by reference.

FIELD OF THE INVENTION

The present invention generally relates to a rotation angle detector for detecting a rotation angle of an object of interest.

BACKGROUND OF THE INVENTION

In recent years, a rotation angle detector is developed and disclosed. For example, a rotation angle detector for detecting a rotation angle based on a detected angle of rotation of a magnetic field is disclosed in transactions of 'Transducers 93' The 7th International Conference on Solid-State Sensors and Actuators, p.p.892 to 895, and in Japanese Patent Document JP-A-H4-302406.

FIGS. 13A and 13B show illustrations of a rotation angle detector 90 disclosed in the above Japanese Patent Document. FIG. 13A is a top view of the rotation angle detector 90, and FIG. 13B is a cross-sectional view of the detector 90 along a XIIIB-XIIIB line in FIG. 13A.

The rotation angle detector 90 shown in FIGS. 13A and 13B has a semiconductor substrate 1 having a trench 1t disposed thereon with two hall elements (Hall elements) on slopes of the trench 1t for detecting the magnetic field. More practically, the rotation angle detector 90 is made from a p-type silicon substrate 1 with {100} crystal face orientation having a wet-etched essentially square trench 1t which has depth of approximately 100 μm. Each of the two opposite slopes in the trench 1t having {111} crystal face orientation has a hall plate, that is, a low concentration n-type impurity diffusion portion 2a/2b. In other words, the two hall elements in the rotation angle detector 90 have hall plate portions disposed in parallel with the slopes of the trench 1t. Therefore, carriers in the hall plates flow in parallel with the slopes of the hall elements.

The rotation angle detector 90 has a high concentration n-type impurity diffusion portion 4 as wiring for the hall elements 2a, 2b. Reference numeral 3p in FIG. 13B indicates a polysilicon film used as a gate electrode when the low concentration impurity diffusion portions 2a and 2b in the hall elements serve as transistors. The polysilicon film 3p is omitted in FIG. 13A for clarity of representation. Wiring for gate electrodes Ga and Gb are shown in FIG. 13A.

The rotation angle detector 90 having the hall elements 2a and 2b disposed on the opposite slopes picks up magnetic field components Ba and Bb respectively normal to surfaces of the slopes in the trench 1t by using the hall elements 2a and 2b when a magnetic field Bo contained in the XIIIB-XIIIB cross section plane is applied to the detector 90. As a result, induced bias currents Ia (ai-ei) and Ib (ai-bee) respectively proportional to the magnetic field components Ba and Bb in the hall elements 2a and 2b are detected as hall voltages Va and Vb. The hall voltages Va and Vb having different phases are processed in a calculation operation such as an arctangent operation or the like for detecting rotation of the magnetic field Bo in the XIIIB-XIIIB cross section plane.

The rotation angle detector 90 as shown in FIGS. 13A and 13B can detect rotation of the magnetic field Bo in a range of 360 degrees. However, the difference of the phases between the hall voltages Va and Vb makes it necessary to use a complicated calculation operation such as the arctangent operation or the like. Therefore, an operation circuit for processing those operations increases both cost and size of the circuit used in the rotation angle detector 90. The size of the operation circuit becomes larger when the circuit has to detect an accurate angle of rotation for a high speed rotation of the magnetic field. The increase in size of the operation circuit leads to an increased cost of production.

SUMMARY OF THE INVENTION

In view of the above-described and other problems, it is an object of the present invention to provide a rotation angle detector having a hall element for detecting rotation of the magnetic field in a high resolution with an advantage in both the size and the production cost.

The rotation angle detector of the present invention is for detecting rotation of a magnetic field. The detector includes a plurality of hall elements for outputting signals having different phases upon detecting rotation of the magnetic field. The detector switches the hall elements to use a portion of an output signal of the hall element having substantially linear output characteristic for detecting rotation of the magnetic field.

The rotation angle detector uses the portion of the output signal having the linear output characteristic for accuracy of detected rotation angle. Therefore, calculation operation such as an arctangent operation or the like is not necessary for calculation of the rotation angle. Thus, the rotation angle detector can be small in size, and can be produced in a cost effective manner for an achieved accuracy.

The rotation angle detector of the present invention detects the magnetic field rotating in a plane perpendicular to a semiconductor substrate of the detector. The hall element of the detector may be a vertical type or a slant type.

Carrier in the hall plate portion formed perpendicularly on the semiconductor substrate flows perpendicular to a surface of the semiconductor substrate in the vertical hall element, and the carrier in the hall portion formed in parallel with a slope of a trench on the surface of the substrate flows parallel to the slope in the slant type hall element. The hall element outputs an output voltage (hall voltage) reflecting a change in magnetic field component in the plane perpendicular to the substrate. Therefore, the vertical hall element or the slant type hall element can use the portion of the output signal having the linear output characteristic for detecting rotation of the magnetic field by sequentially switching a plurality of the hall elements disposed on the semiconductor substrate.

The hall elements of the present invention are arranged circularly around a rotation center of the magnetic field in a ring shape having a same angle to an adjacent element. In this manner, the hall elements can detect rotation of the magnetic field in a range of 360 degrees.

The hall elements may be arranged in a first circle around the rotation center having a same angle to each other with a second circle of elements with a different radius of the circle around the rotation center. In this manner, the output signal of the hall element in the first circle may be compared with the output signal of the hall element in the second circle to calculate an absolute angle of rotation. For example, the output signal of the hall element in the second circle may be used as an angle of zero degree to detect rotation in a range of 360 degrees. In this manner, the rotation angle detector may detect rotation of the magnetic field while the detector is turned off.

Number of the hall elements in the ring shape is preferably equal to or greater than three and, is preferably equal to or smaller than twelve.

The hall element of the rotation angle detector is switched in every 120 degrees (±60 degrees) when three hall elements are used in the detector. In this manner, the output characteristic of each of the hall elements is substantially linear. The amount of the rotation angle in charge of each of the hall elements becomes smaller when the detector uses greater number of hall elements for improved accuracy. However, switching between the hall elements may be too frequent when the number of the element exceeds a certain threshold. The detector having twelve elements may have sufficient accuracy based on a linearity of the output signal by allocating 30 degrees (±15 degrees) to each of the hall element.

The rotation angle detector uses a silicon substrate having {100} crystal face orientation for the semiconductor substrate. Four hall elements on the silicon substrate are disposed in line with a <010> direction and in a <001> direction relative to the rotation center. The hall elements may be disposed in line with a <011> direction and in a <0-11> direction relative to the rotation center.

The output voltage (i.e., the hall voltage) of the hall element is proportional to mobility of the carrier. The mobility of the carrier is different according to each crystal face orientation. The mobility of the carrier in each of the above-described cases, that is, each pair of crystal face orientations yields same mobility in each of the cases for all of the four hall elements used therein. Therefore, the output signal in each of the cases has the same output characteristic for accurately detecting the rotation angle.

The rotation angle detector has a plurality of through holes in the semiconductor substrate in an area outside of the circle of the hall element described above in positions of rotational symmetry. The through holes symmetrically arranged in a peripheral area of the substrate contribute to separation of the hall elements from other portion of the substrate. In this manner, stress to the hall elements can be decreased. Further, an offset voltage caused by the stress from a package of a semiconductor or the like can be decreased.

The rotation angle detector may have a signal process circuit for switching the signals from the plurality of the hall elements in an area inside the ring shape of the hall elements. In this manner, wiring length between the signal process circuit and the hall elements may be decreased, and the size of the package of the rotation angle detector may be made smaller.

The signal process circuit may be located outside of the ring shape of the hall elements. A parallel magnetic field in a narrow area of space may be detected with accuracy in this manner because of a decreased effect from displacement of positions.

The hall elements may be disposed in a room not occupied by the signal process circuit. In this manner, the size of the detector chip may be decreased.

The signal process circuit may be made by using, for example, a switch circuit, a multiplexer circuit or a demultiplexer circuit.

The signal process circuit may include an adjustment circuit for the offset voltage and/or the output voltage of the hall element.

The offset voltage and/or the output voltage may be adjusted by controlling resistance of a resistor connected to the hall element. The resistance of the resistor may be controlled by, for example, trimming a thin film resistor, fusing the resistor or short-circuiting a resistor circuit by using a zenar-zapping. The adjustment of resistance may be made in a wafer stage, or may be made as an assembled product.

The offset voltage and/or the output voltage may be adjusted by using a result of operation process based on memorized data for the offset voltage and/or the output voltage of the hall element. The memorized data may be retained in, for example, an EPROM, an EEPROM, a flash memory, an SRAM or a DRAM.

The signal process circuit may include a spinning current circuit or a chopper circuit for the plurality of the hall elements. In this manner, the offset voltages of the corresponding hall elements in the ring shape may be cancelled.

The hall elements in the rotation angle detector may be a combination of at least two of a horizontal type, the vertical type and the slant type of the hall elements for detecting the rotation angle of the magnetic field rotating in the plane perpendicular to the surface of the semiconductor substrate.

The hall elements of the above-described types, or combination of the hall elements may be used to output the output signal having a substantially linear output characteristic by selectively using the hall elements with the substantially linear output characteristic when the hall elements are disposed on a surface of the semiconductor substrate to detect the magnetic field perpendicularly rotating relative to the surface of the substrate. Thus, the rotation angle detector having a high resolution with an advantage of packaging size may be produced in a cost effective manner.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENTS

Preferred embodiments of the present invention are described with reference to the drawings.

First, hall elements are described in terms of its principle of operation with reference to the drawings.

Figure 1A:
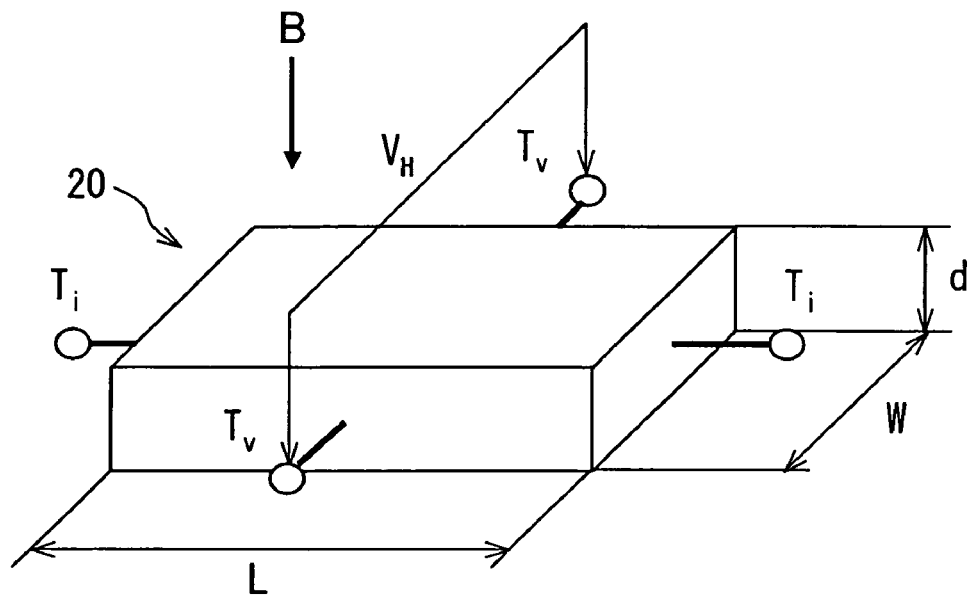
FIG. 1A is an illustration of operation principle of a hall element.
Figure 1B:
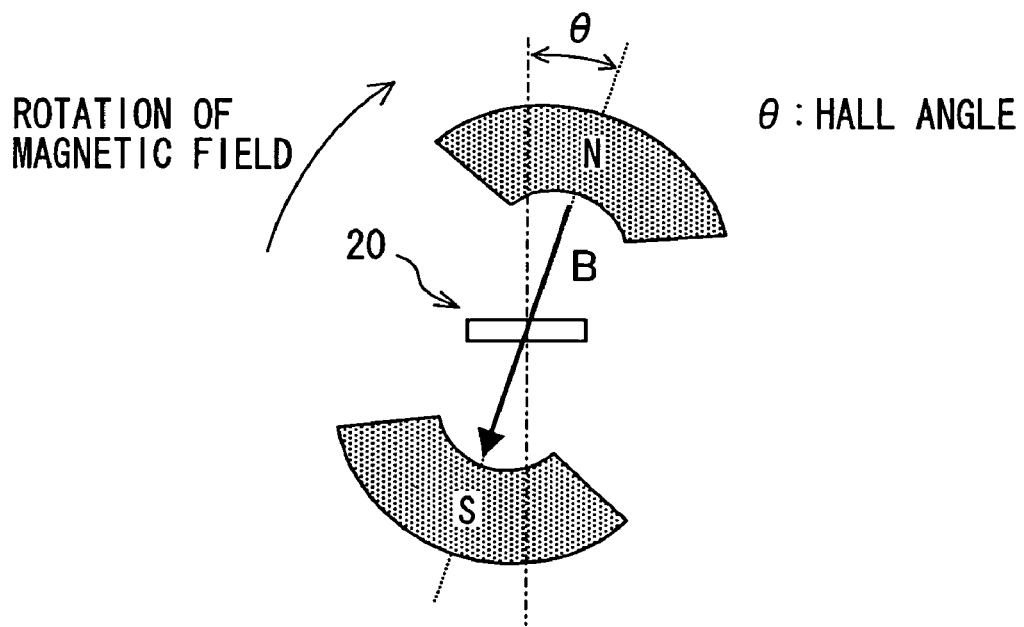
FIG. 1B is another illustration of operation principle of the hall element.

FIGS. 1A and 1B show a principle of operation of a general hall element. Hall effect of a semiconductor is seen as a voltage (hall voltage) perpendicular to both of a magnetic field and a flow of carrier when a conductor (i.e., a hall element 20) is placed perpendicularly to the magnetic field.

A relationship between the thickness d of the hall element 20, a current I between the terminals Ti, a magnetic flux density B applied perpendicularly to the hall element 20 and an output voltage (hall voltage) $V_H$ between output terminals Tv is shown by an equation 1. In the equation 1, $R_H$ represents a hall coefficient according to a material used for the hall element 20. L and W in FIG. 1A respectively represent length and width of the hall element.

$$V_H = R_H \frac{IB}{d} \quad \text{[Equation 1]}$$

The output voltage $V_H$ is represented as a product of the equation 1 and a cosine θ as shown in an equation 2 when an angle θ (hall angle) between a normal line of a surface of the hall element 20 and the magnetic field of the magnetic flux density B changes in a rotation of the magnetic field as shown in FIG. 1B. Therefore, the output voltage of the hall element 20 is represented as a sine wave when the element 20 and the magnetic field from N pole to S pole rotate relative to each other. The output voltage in the sine wave can be used to detect a rotation angle of the magnetic field having the magnetic flux density B.

$$V_H = R_H \frac{IB}{d} \cos\theta \quad \text{[Equation 2]}$$

Figure 13A:
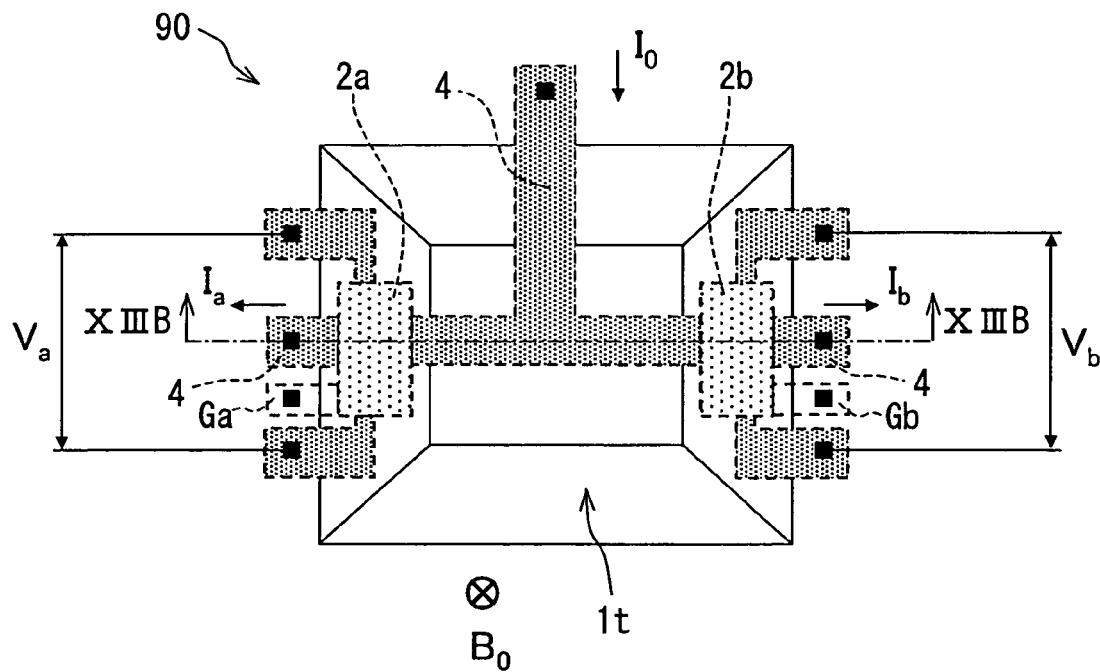
FIG. 13A is a top view of a conventional rotation angle detector.
Figure 13B:
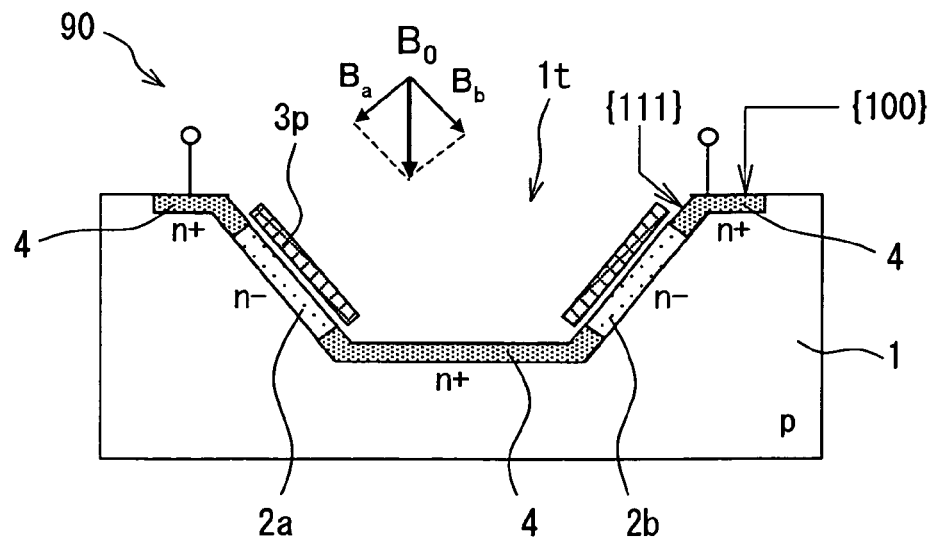
FIG. 13B is a cross-sectional view of the conventional rotation angle detector along a XIIIB-XIIIB line in FIG. 13A.

The hall element formed on a semiconductor substrate can be categorized into three types based on a direction of carrier flow. FIGS. 13A and 13B show a slant type hall element that has a hall plate formed in parallel with a slope of a trench on the surface of the semiconductor substrate for enabling the direction of the carrier flow to be parallel with the slope.

Figure 2A:
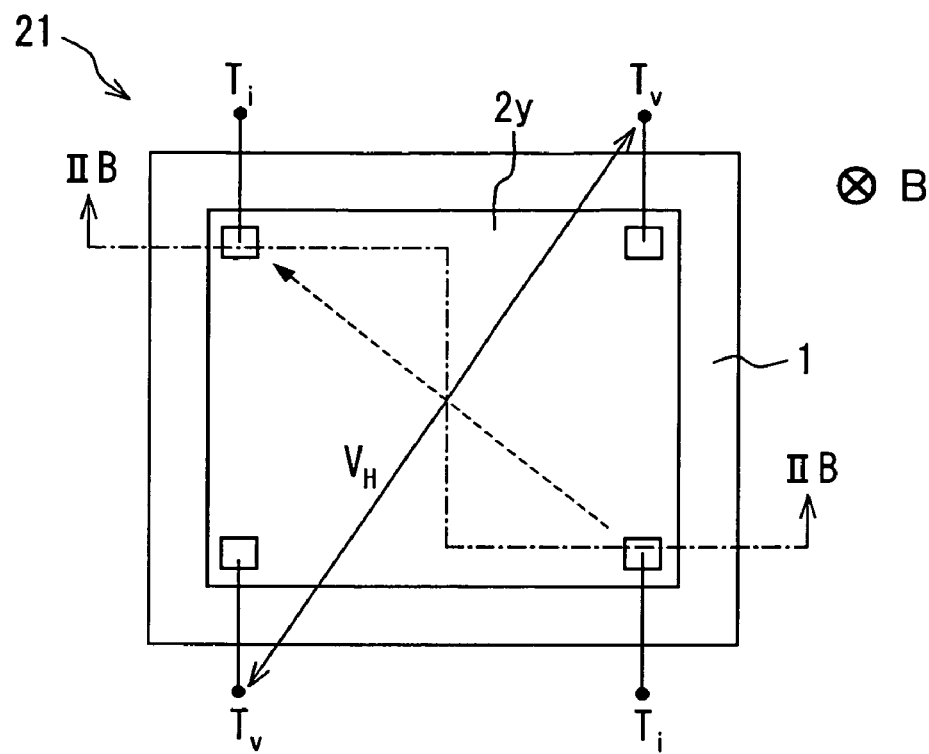
FIG. 2A is a top view of a horizontal type hall element.
Figure 2B:
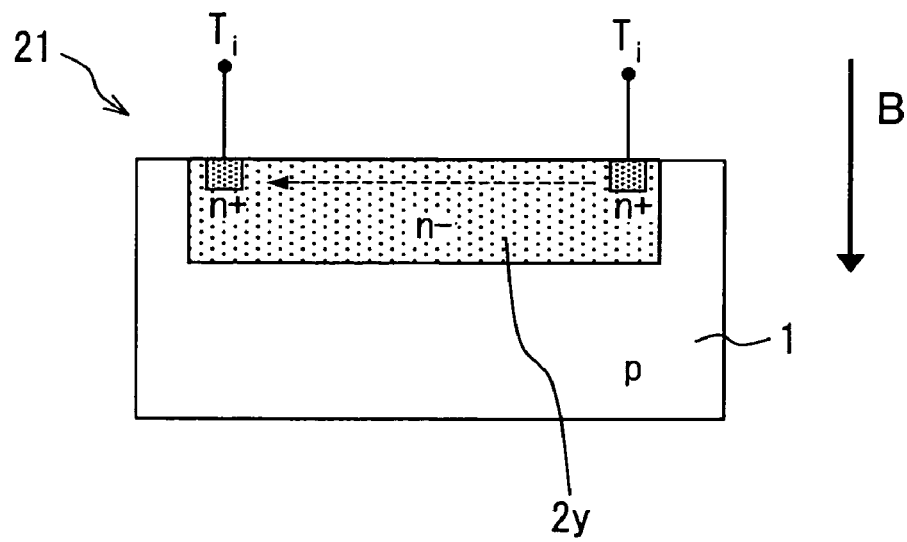
FIG. 2B is a cross-sectional view of the horizontal type hall element along a IIB-IIB line in FIG. 2A.

FIGS. 2A and 2B show a horizontal hall element 21 in a commonly used form. More practically, FIG. 2A shows a top view of the horizontal hall element 21, and FIG. 2B shows a cross-sectional view of the horizontal hall element 21 taken along a IIB-IIB line in FIG. 2A.

Horizontal hall elements have a hall plate portion formed in parallel with the surface of the semiconductor substrate, and enable the carrier flow to be parallel with the surface of the substrate. The horizontal hall element 21 shown in FIGS. 2A and 2B has a low concentration n-type impurity diffusion portion (n-) formed in parallel with the surface of the semiconductor substrate 1 as a hall plate portion 2y. Carrier flows in parallel with the surface of the semiconductor substrate 1 between the terminals Ti as indicated a dotted arrow in FIG. 2B. The output voltage (hall voltage) Vh induced by the magnetic field perpendicularly crossing the hall plate portion 2y is detected as difference of voltage between the terminals Tv.

Figure 3A:
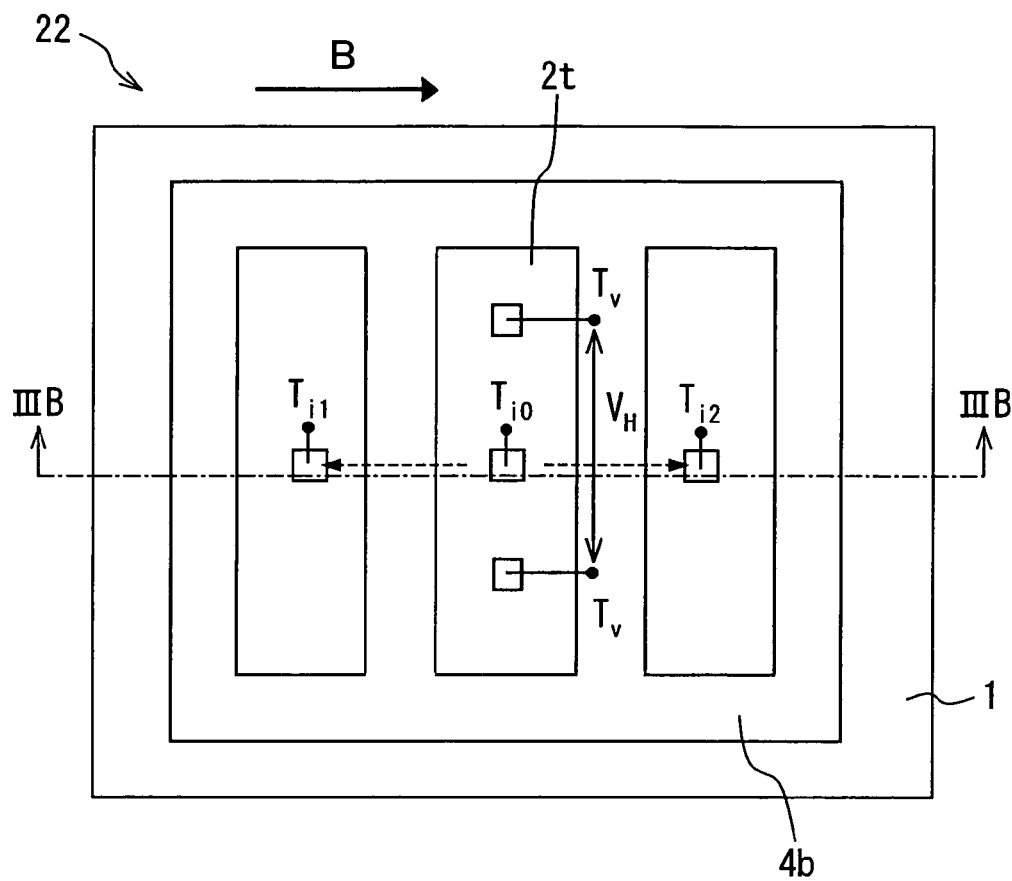
FIG. 3A is a top view of a vertical hall element.
Figure 3B:
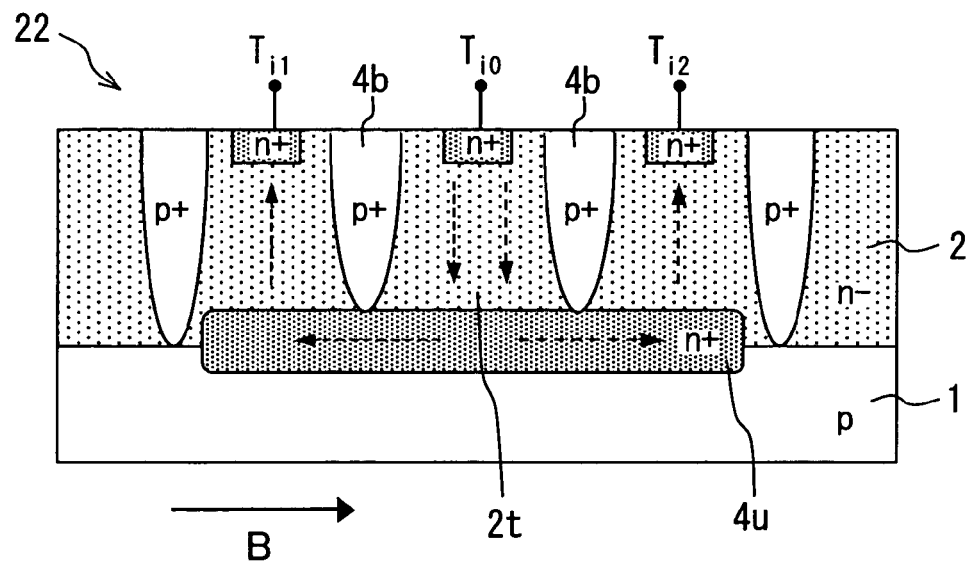
FIG. 3B is a cross-sectional view of the vertical hall element along a IIIB-IIIB line in FIG. 3A.

FIGS. 3A and 3B show a vertical hall element 22. More practically, FIG. 3A shows a top view of the vertical hall element 22, and FIG. 3B shows a cross-sectional view of the vertical hall element 22 taken along a IIIB-IIIB line in FIG. 3A.

Vertical hall elements have a hall plate portion formed perpendicularly to the surface of the semiconductor substrate, and enable the carrier flow to be perpendicular to the surface of the semiconductor substrate. FIGS. 3A and 3B show a vertical hall element 22 having a junction-separation portion. That is, the low concentration n-type diffusion portion (n-) 2 is separated by high concentration p-type portions 4b to form a hall plate portion 2t perpendicularly to the surface of the semiconductor substrate 1. The carrier flows perpendicularly to the surface of the substrate 1 respectively between the terminals $T_{i0}$ and $T_{i1}$ and between the terminals $T_{i0}$ and $T_{i2}$ through a high concentration n-type embedded portion 4u as indicated by the dotted arrow in FIG. 3B. In this case, the hall plate portion 2t at a center in FIGS. 3A and 3B serves as an element. The output voltage $V_H$ (hall voltage) is detected as the voltage between the terminals Tv.

The vertical hall element may be formed variably in many shapes besides the shape shown in FIGS. 3A and 3B. For example, the high concentration n-type embedded portion 4u may be omitted for enabling the carrier flow from $T_{i0}$ to reach the terminals $T_{i1}$ and $T_{i2}$ through a path around an end of the p-type high concentration portion 4b. The junction-separation portion by using the high concentration p-type portion 4b may be replaced with a trench-separation portion. The vertical hall element 22 shown in FIGS. 3A and 3B having two carrier flows from $T_{i0}$ towards right and left terminals $T_{i1}$ and $T_{i2}$ may be a single carrier flow to either of the terminals.

The rotation angle detector of the present invention is described in the following explanation.

FIRST EMBODIMENT

Figure 4A:
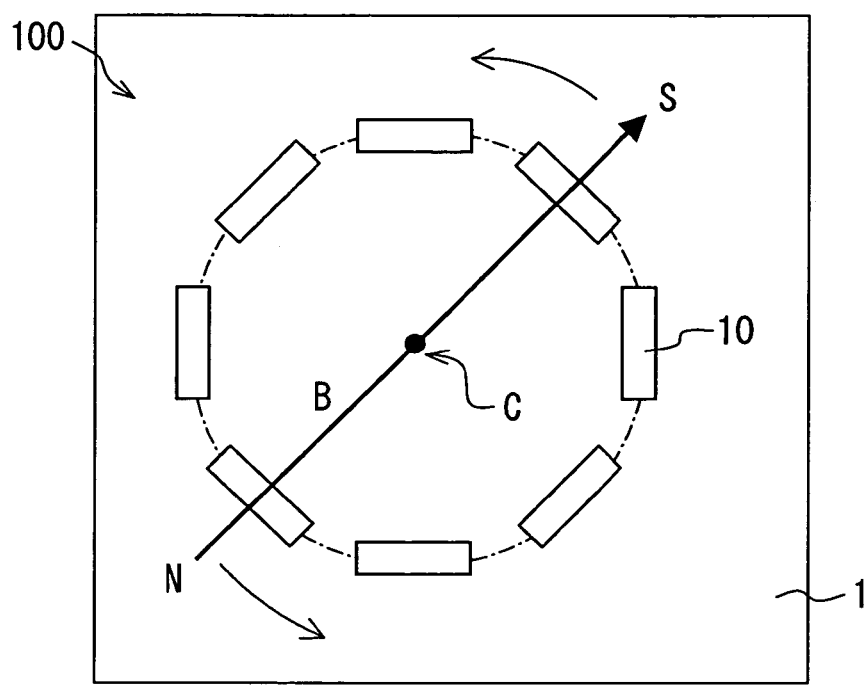
FIG. 4A is a top view of a rotation angle detector in a first embodiment of the present invention.
Figure 4B:
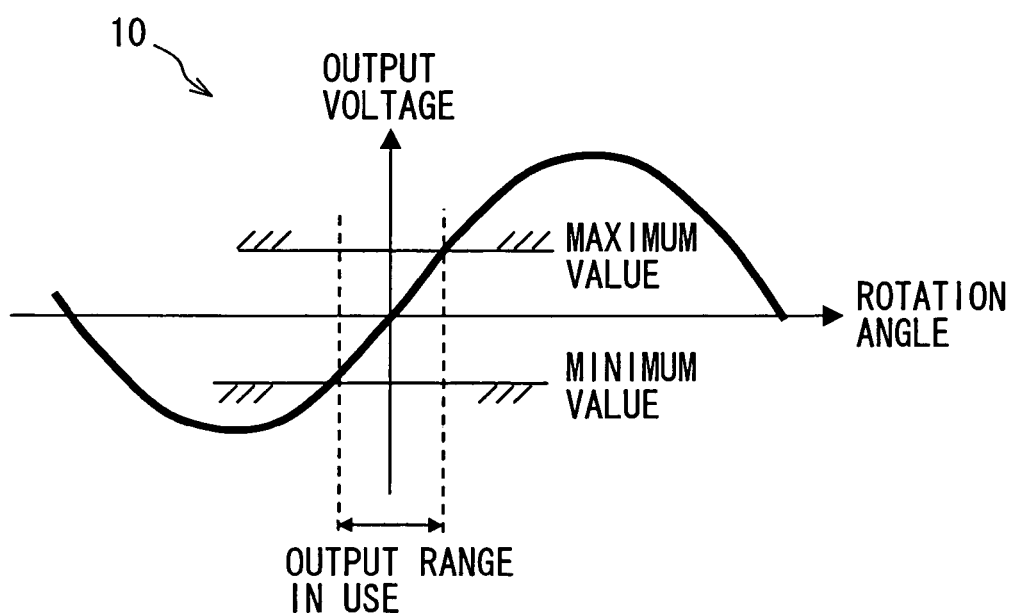
FIG. 4B is a diagram of relationship between a rotation angle of a magnetic field and an output voltage in each of the hall elements in the rotation angle detector.

FIG. 4A shows a top view of a rotation angle detector 100 in a first embodiment of the present invention. FIG. 4B shows a diagram of relationship between the rotation angle of a magnetic field and the output voltage from each of hall elements 10 in the detector 100.

The rotation angle detector 100 detects the rotation angle of the magnetic field represented by a thick arrow in FIG. 4A. The magnetic field (magnetic flux density B), or the thick arrow, rotates in a plane that is perpendicular to a surface of the semiconductor substrate 1. As shown in FIG. 4A, the semiconductor substrate 1 has the eight hall elements 10 equiangularly disposed in a ring shape around a rotation axis C of the magnetic field on one side of the substrate 1. More practically, the vertical hall element shown in FIGS. 3A and 3B or the slant type hall element shown in FIGS. 13A and 13B are used as the hall element 10. Number of hall plate portions may be at least one on either of the two slope of the trench when the hall element is the slant type.

The rotation angle detector 100 in FIG. 4A switches the eight hall elements 10 when it detects the rotation angle of the magnetic field. The output voltage (hall voltage) of the hall element 10 changes according to magnetic field components in a plane in parallel with the semiconductor substrate 1. More practically, the output voltage of the hall element 10 has an output characteristic in a sine wave shape as shown in FIG. 4B. Therefore, only a straight portion of the output characteristic in the sine wave shape is used to detect the rotation angle of the magnetic field. That is, the sine wave shape of the output characteristic is trimmed by predetermined maximum and minimum output voltages to be used as a substantially linear function. The hall elements 10 arranged in an equiangular ring shape are sequentially switched for detecting the rotation angle of the magnetic field by using the linear portion of the output characteristic of the elements 10. Each of the eight hall elements 10 in the present embodiment covers 45 degrees of rotation, and sequentially switching use of 45 degree coverage enables a whole 360 degree detection coverage by the rotation angle detector 100.

The rotation angle detector 100 in FIG. 4A detects the rotation angle by using the linear portion of the output characteristic of each hall element 10 for minimizing a detection error. Therefore, accuracy of the detector 100 is improved. The sequential switching use of the eight hall elements makes it possible to calculate the rotation angle without employing an operation process such as the arctangent operation or the like that requires a larger size of circuitry for complicated calculation. In this manner, the rotation angle detector 100 is both small in size and cost effective.

The rotation angle detector 100 preferably uses at least three hall elements 10 arranged in the ring shape. Further, the number of the hall elements are preferably equal to or less than twelve. The number of the hall elements 10 are determined based on a trade-off between the linearity of the output characteristic in the allocated coverage angle of each hall element 10 and complication of the switching operation. For example, three hall elements 10 can be used to cover 360 degrees when each hall element 10 covers 120 degrees (±60 degrees), and twelve hall elements 10 are used to cover 360 degrees with 30 degrees (±15 degrees) coverage of each element 10. In this manner, the rotation angle of the magnetic field can accurately be detected by the rotation angle detector 100 in the present embodiment.

Figure 5A:
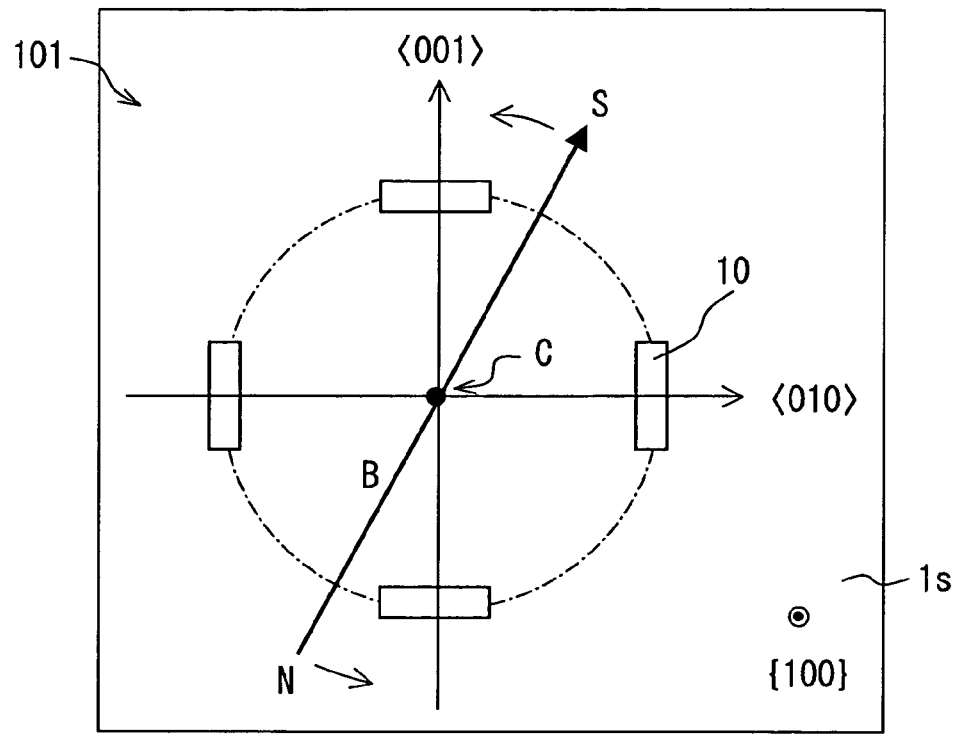
FIG. 5A is a top view of another rotation angle detector in the first embodiment.
Figure 5B:
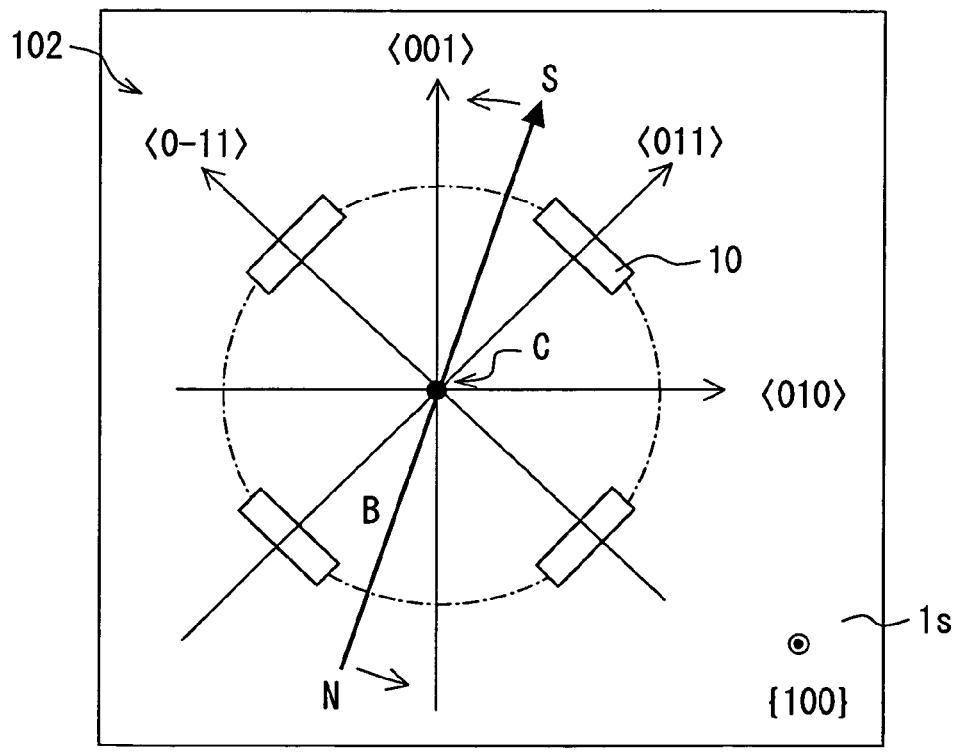
FIG. 5B is a top view of yet another rotation angle detector in the first embodiment.

FIGS. 5A and 5B show top views of different embodiments of rotation angle detectors 101 and 102.

The rotation angle detectors 101 and 102 use the vertical hall elements 10 or the slant type hall elements 10. In these cases, four hall elements 10 are arranged on one side of a silicon substrate 1s having {100} crystal face orientation. That is, the rotation angle detector 101 has four hall elements 10 disposed in a <010> direction and a <001> direction relative to the rotation axis, the rotation angle detector 102 has four elements 10 disposed in a <011> direction and <0-11> direction relative to the rotation axis.

The output voltage of the hall elements 10 are proportional to mobility of the carrier. The mobility of the carrier is different according to the crystal face orientation of the semiconductor substrate 1. The four hall elements 10 in the rotation angle detectors 101 and 102 have the same carrier mobility for all of the four elements 10. Therefore, the output characteristic of the four elements 10 can be used in the same manner to accurately detect the rotation angle.

Figure 6:
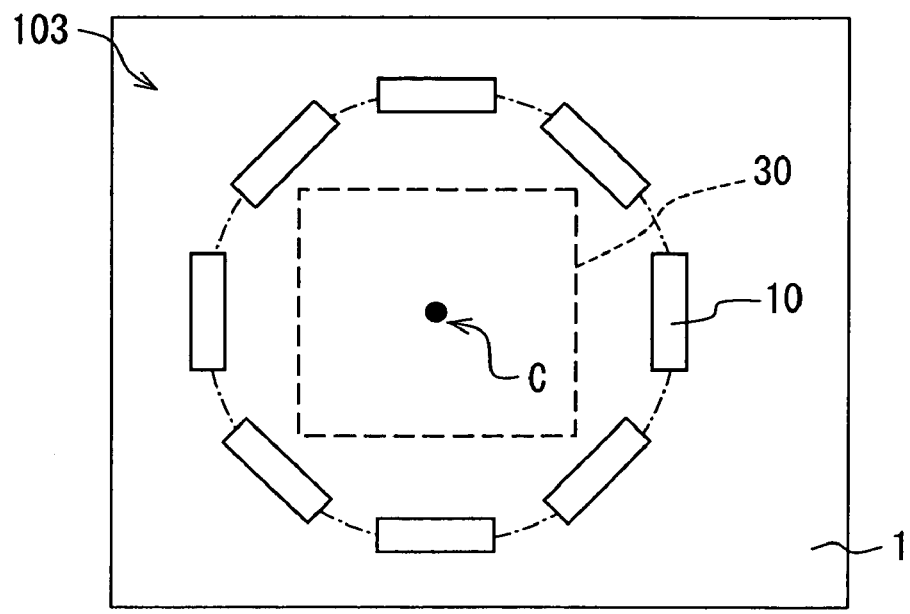
FIG. 6 is a top view of still another rotation angle detector in the first embodiment.

FIG. 6 shows a top view of yet another rotation angle detector 103. The rotation angle detector 103 has a signal process circuit 30 represented by a dashed line to control the switching use of eight hall elements 10 of either of the vertical type or the slant type. The signal process circuit 30 uses, for example, a switch circuit, a multiplexer circuit or a demultiplexer circuit for signal switching process of the elements 10.

The signal process circuit 30 may include a circuit for adjustment of an offset voltage and/or output voltage of the hall element 10. The offset voltage and/or the output voltage may be adjusted by controlling resistance of a resistor connected to the hall element 10. The resistance of the resistor may be controlled by trimming a thin film resistor, fusing the resistor or short-circuiting a resistor circuit by using a zenar-zapping. The adjustment of resistance may be made in a wafer stage, or may be made as an assembled product.

The offset voltage and/or the output voltage may be adjusted by using a result of operation process based on memorized data for the offset voltage and/or the output voltage of the hall element 10. The memorized data may be retained in, for example, an EPROM, an EEPROM, a flash memory, an SRAM or a DRAM.

Further, the signal process circuit 30 may include a spinning current circuit or a chopper circuit for the plurality of the hall elements 10. In this manner, the offset voltages of the corresponding hall elements in the ring shape may be cancelled.

The rotation angle detector 103 has the signal process circuit 30 in the ring shape of the hall elements 10. In this manner, wiring length between the signal process circuit 30 and eight hall elements 10 is decreased, and the size of the package of the detector 103 is made smaller.

The rotation angle detectors 100 to 103 shown in FIGS. 4A to 6 can be used to detect a bi-directional magnetic field rotation (combination of clockwise and counterclockwise magnetic field rotations) in any range of angles besides detecting a continuous rotation in a predetermined direction.

Figure 7:
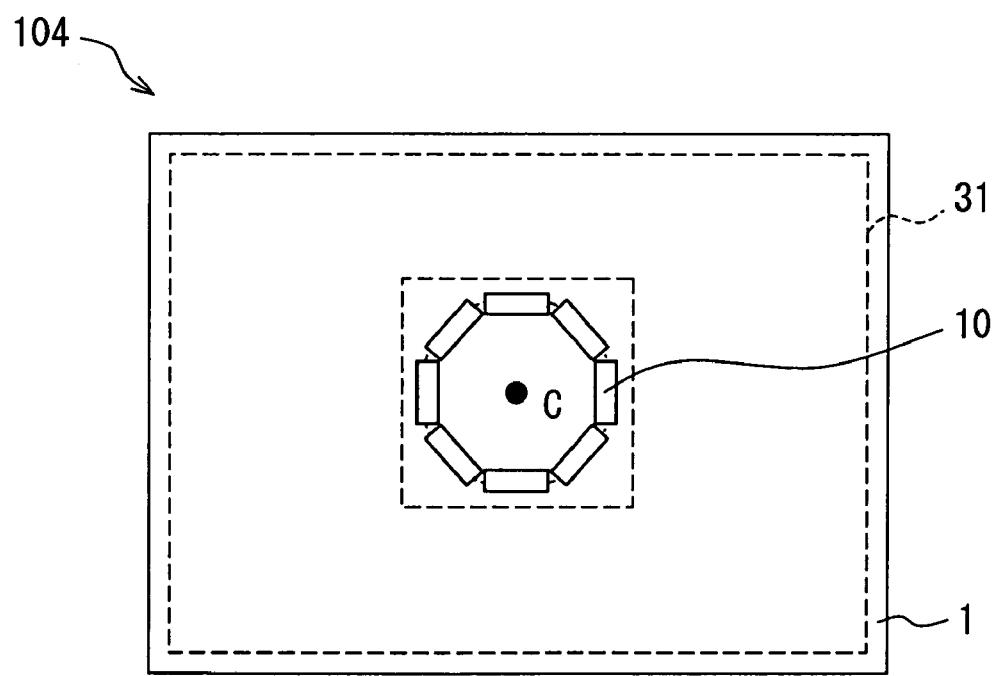
FIG. 7 is a top view of still differently embodied rotation angle detector in the first embodiment.

FIG. 7 shows a top view of still another rotation angle detector 104. The rotation angle detector 104 has a signal process circuit 31 for switching process in an area outside of the ring shape of the eight hall elements 10. The hall elements 10 may be the vertical type or the slant type. In this manner, the rotation angle detector 104 can accurately detect a magnetic field having a narrow parallel magnetic flux because displacement of positions in rotation angle measurement affects less to this structure.

Figure 8:
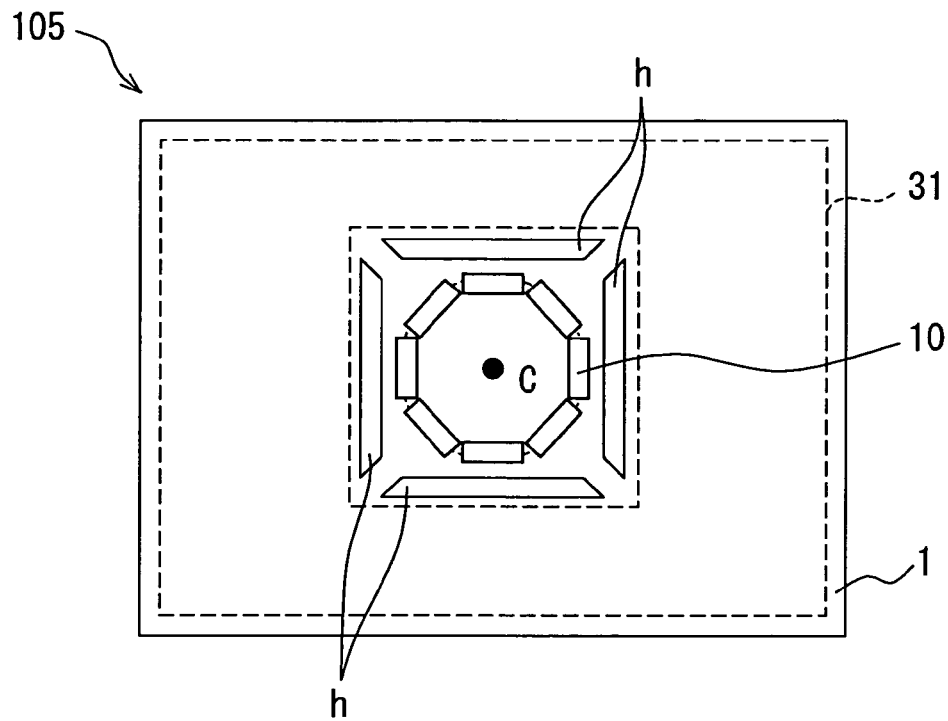
FIG. 8 is a top view of still differently embodied rotation angle detector in the first embodiment.

FIG. 8 shows a top view of still yet another rotation angle detector 105. The rotation angle detector 105 has four through holes h symmetrically bored in an area outside of the ring shape of the hall elements 10 on the semiconductor substrate 1. The hall elements 10 are separated from other area of the substrate 1 by the through holes h. The through holes h serve as a buffer for stress or the like from other area of the substrate 1. In this manner, the offset voltage of the hall element 10 caused by stress from a package of the semiconductor or the like is decreased. The number of the through holes h may be arbitrarily determined as long as the through holes are disposed symmetrically around a rotation center C.

Figure 9:
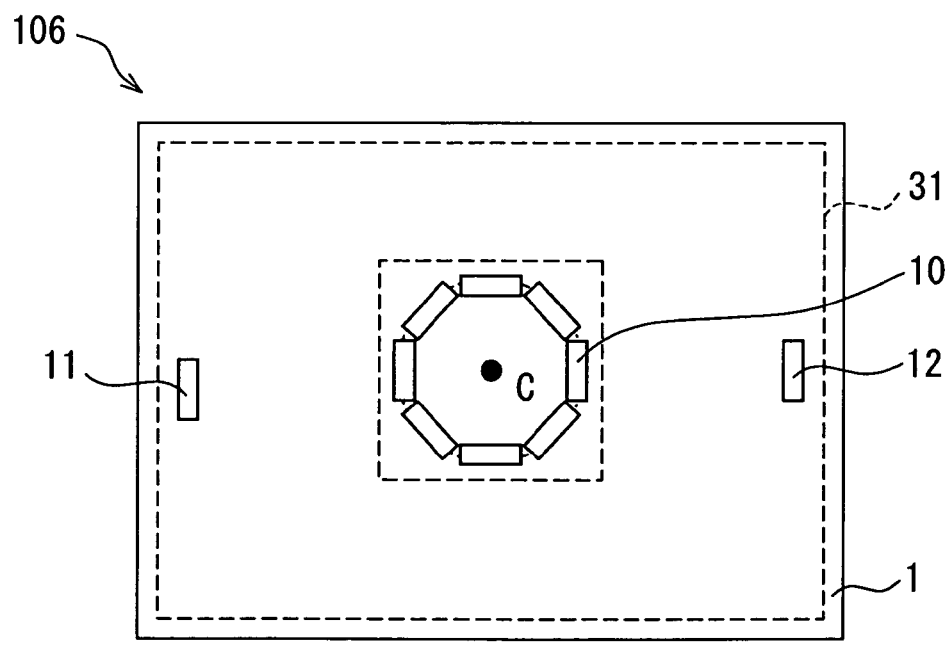
FIG. 9 is a top view of still differently embodied rotation angle detector in the first embodiment.

FIG. 9 shows a top view of still yet another rotation angle detector 106. The rotation angle detector 106 has hall elements 11 and 12 in addition to the hall elements 10 arranged in the ring shape as shown in FIG. 7. The rotation angle of the magnetic field can be absolutely detected by comparing a signal from the hall element 10 and a signal from the hall element 11 or 12. For example, the signal from the hall element 11 may be used as a reference position (0 degree) and a signal from the hall element 12 may be used as another reference position (180 degree) to detect the absolute rotation angle of the magnetic field. This scheme may also enable rotation angle detection between system operations. The number of the hall elements 11 and 12 separately disposed from the hall elements 10 may be arbitrarily determined.

Figure 10:
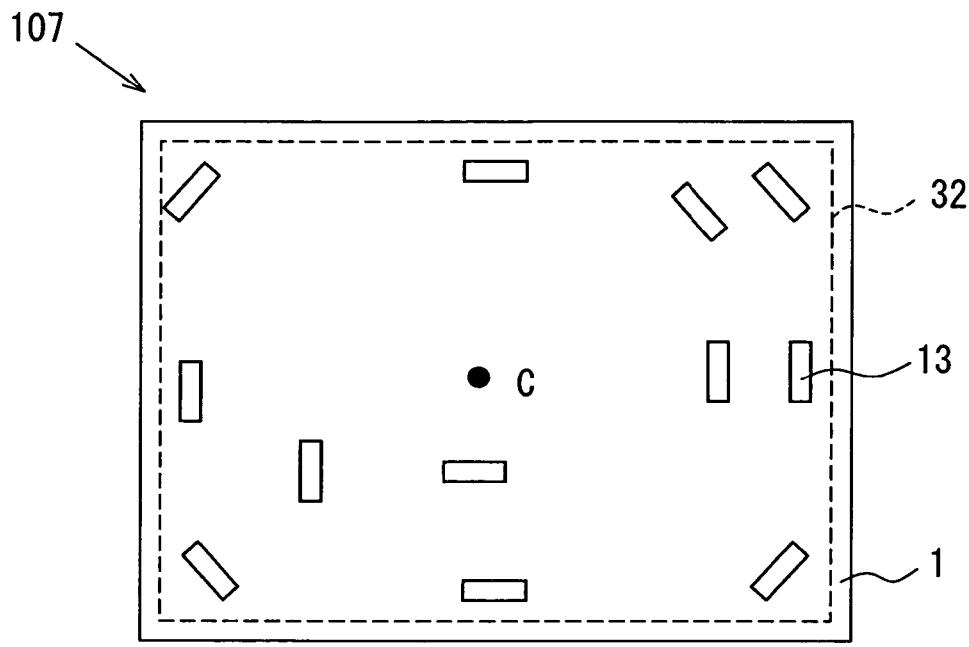
FIG. 10 is a top view of still differently embodied rotation angle detector in the first embodiment.

FIG. 10 shows a top view of still yet another rotation angle detector 107. The rotation angle detector 107 has a plurality of hall elements 13 distributively disposed in vacant areas of the signal process circuit 32. In this manner, space efficiency of the semiconductor chip is improved, and the size of the semiconductor chip can be decreased.

SECOND EMBODIMENT

The rotation angle detector in a second embodiment detects the rotation angle of the magnetic field rotating in a plane that is perpendicular to the surface of the semiconductor substrate 1.

FIGS. 11A to 11C and 12 show perspective views of portions of cross sections of rotation angle detectors 200 to 203.

The rotation angle detectors 200 to 203 are used for detecting the rotation angle of the magnetic field (magnetic flux density B) rotating in a plane that is perpendicular to the surface of the semiconductor substrate 1. The rotation angle detector 200 shown in FIG. 11A includes both of the horizontal type hall elements 21 in FIGS. 2A and 2B and the vertical hall elements 22 in FIGS. 3A and 3B. The rotation angle detector 201 shown in FIG. 11B includes both of the slant type hall elements 23 in FIGS. 13A and 13B and the horizontal type hall elements 21. The rotation angle detector 202 includes the slant type hall elements 23 and the vertical hall elements 22. The rotation angle detector 203 includes the horizontal type hall elements 21, the vertical hall elements 22 and the slant type hall elements 23.

FIGS. 11A to 11C and FIG. 12 show the rotation angle detectors 200 to 203 that sequentially switch the plurality of the hall elements 21 to 23. Each of the hall elements 21 to 23 outputs the output voltage (hall voltage) proportional to the change of the magnetic field component of the magnetic field (magnetic flux density B) rotating in the plane perpendicular to the semiconductor substrate 1. The hall elements 21 to 23 in combination of two element types or more are disposed on one side of the semiconductor substrate 1. The hall element outputting a substantially linear portion of the output characteristic is selectively chosen to detect the rotation angle of the magnetic field as described in the first embodiment. Therefore, the rotation angle detectors 200 to 203 shown in FIGS. 11A to 11C and FIG. 12 for accurately detecting the rotation angle of the magnetic field rotating in the plane that is perpendicular to the surface of the semiconductor substrate 1 has advantages in the package size and production cost.

Although the present invention has been fully described in connection with the preferred embodiments thereof with reference to the accompanying drawings, it is to be noted that various changes and modifications will become apparent to those skilled in the art.

Figure 12:
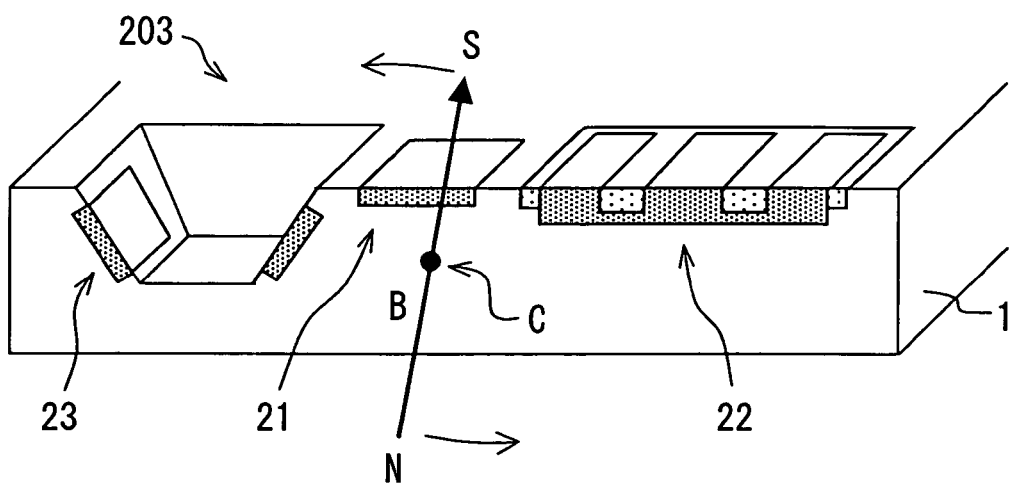
FIG. 12 is a perspective view of a cross section of a portion of still another rotation angle detector in the second embodiment.
Figure 11A:
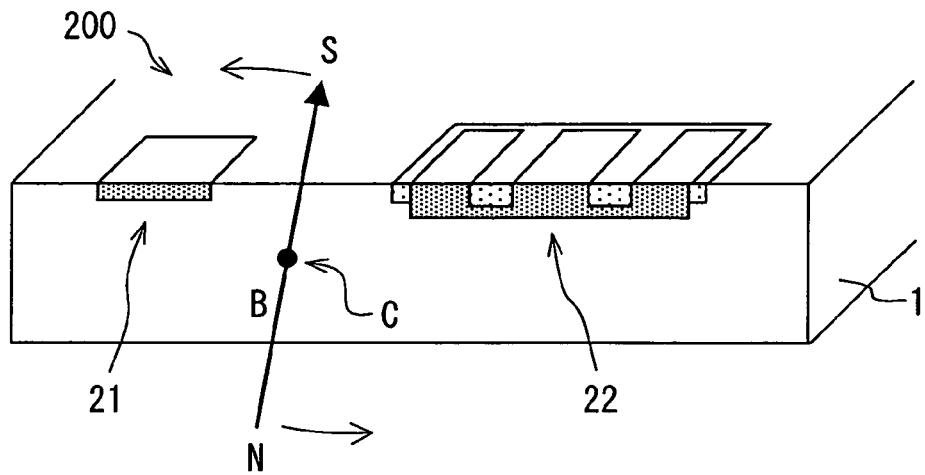
FIG. 11A is a perspective view of a cross-section of a portion of a rotation angle detector in a second embodiment.
Figure 11B:
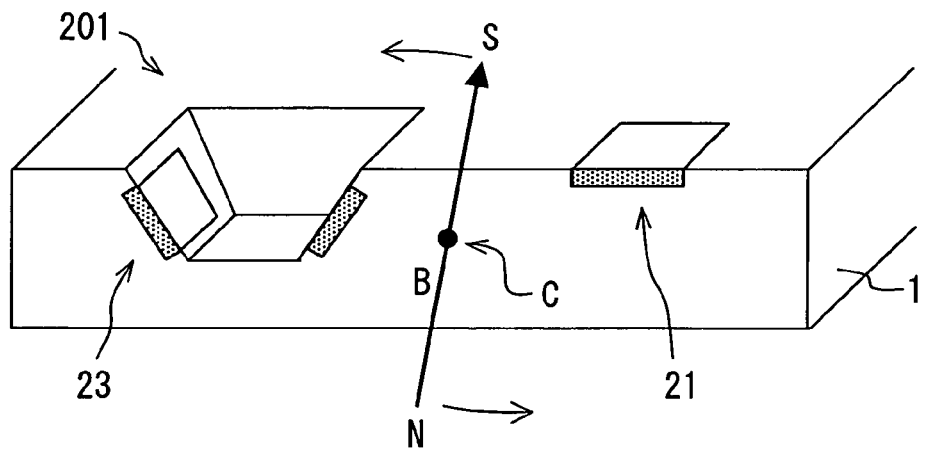
FIG. 11B is a perspective view of a cross section of a portion of another rotation angle detector in the second embodiment.
Figure 11C:
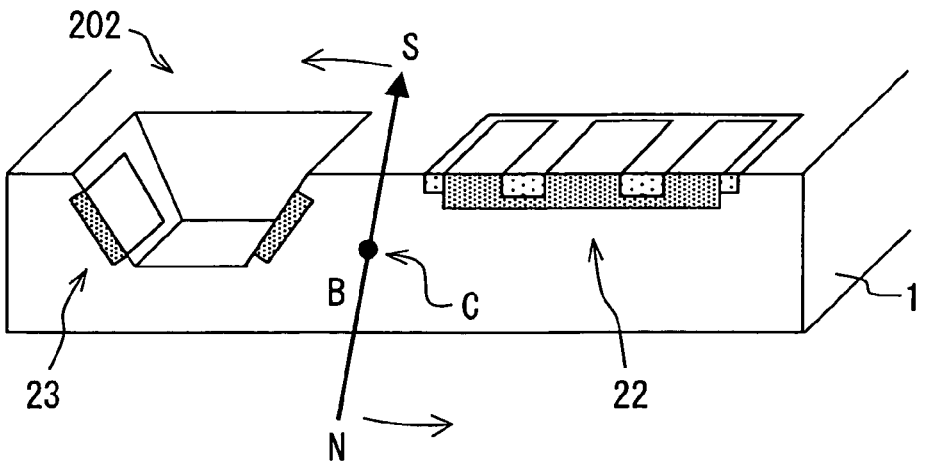
FIG. 11C is a perspective view of a cross section of a portion of yet another rotation angle detector in the second embodiment.

For example, the slant type hall element 23 in FIGS. 11B, 11C and 12 has two hall plate portions disposed on the slope of the trench. However, the number of the hall plate portions may be at least one on either slope of the trench.

Further, the hall elements shown in FIGS. 11B, 11C and 12 are combination of single hall element 21, 22 and/or 23. However, a plurality of hall elements 21, 22 and/or 23 may be used in the combination.

Further, the rotation angle detectors 200 to 203 shown in FIGS. 11A to 11C and FIG. 12 can be used to detect a bi-directional magnetic field rotation (combination of clockwise and counterclockwise magnetic field rotations) in any range of angles besides detecting a continuous rotation in a predetermined direction.

Such changes and modifications are to be understood as being within the scope of the present invention as defined by the appended claims.

What is claimed is:

1. A rotation angle detector for detecting a rotation angle of a magnetic field comprising:
   a plurality of Hall elements on one side of a semiconductor substrate for outputting an output signal having a different phase respectively induced by the magnetic field; and
   a plurality of through holes arranged in an area adjacent to an outside of the ring shape of the Hall elements on the semiconductor substrate,
   wherein a portion of the output signal from one of the plurality of Hall elements that has a substantially linear output characteristic relative to the rotation angle of the magnetic field is selectively used to detect the rotation angle,
   wherein the magnetic field rotates in a plane in parallel with the semiconductor substrate,
   wherein the Hall element is either of a vertical type and a slant type,
   wherein the Hall elements are disposed equiangularly in a ring shape around a rotation center of the magnetic field,
   wherein the number of the Hall elements is equal to or greater than three,
   wherein the number of the Hall elements is equal to or smaller than twelve,
   wherein the semiconductor substrate is made from a silicon substrate having {100} crystal face orientation,
   wherein the Hall elements are aligned to a <011> direction and a <011> direction relative to the rotation center of the magnetic field,
   wherein the through holes are arranged in rotationally symmetrical positions around the rotation center, and
   wherein a signal process circuit for switching signals from the plurality of Hall elements is positioned in an area inside of the ring shape of the Hall elements.

2. A rotation angle detector for detecting a rotation angle of a magnetic field comprising:
   a plurality of Hall elements on one side of a semiconductor substrate for outputting an output signal having a different phase respectively induced by the magnetic field; and
   a plurality of through holes arranged in an area adjacent to an outside of the ring shape of the Hall elements on the semiconductor substrate,
   wherein a portion of the output signal from one of the plurality of Hall elements that has a substantially linear output characteristic relative to the rotation angle of the magnetic field is selectively used to detect the rotation angle,
   wherein the magnetic field rotates in a plane in parallel with the semiconductor substrate,
   wherein the Hall element is either of a vertical type and a slant type,
   wherein the Hall elements are disposed equiangularly in a ring shape around a rotation center of the magnetic field,
   wherein the number of the Hall elements is equal to or greater than three,
   wherein the number of the Hall elements is equal to or smaller than twelve,
   wherein the semiconductor substrate is made from a silicon substrate having {100} crystal face orientation,
   wherein the Hall elements are aligned to a <011> direction and a <011> direction relative to the rotation center of the magnetic field,
   wherein the through holes are arranged in rotationally symmetrical positions around the rotation center, and
   wherein a signal process circuit for switching signals from the plurality of Hall elements is positioned in an area outside of the ring shape of the Hall elements on the semiconductor substrate.

* * * * *